United States Patent
Jeon et al.

(10) Patent No.: US 7,888,739 B2
(45) Date of Patent: Feb. 15, 2011

(54) ELECTROSTATIC DISCHARGE CIRCUIT AND METHOD OF DISSIPATING AN ELECTROSTATIC CURRENT

(75) Inventors: Chan-hee Jeon, Gyeonggi-Do (KR); Han-gu Kim, Gyeonggi-Do (KR); Sung-pil Jang, Gyeonggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 754 days.

(21) Appl. No.: 11/201,365

(22) Filed: Aug. 11, 2005

(65) Prior Publication Data

US 2006/0175663 A1 Aug. 10, 2006

(30) Foreign Application Priority Data

Feb. 7, 2005 (KR) .................. 10-2005-0011296

(51) Int. Cl.
  *H01L 23/62* (2006.01)
(52) U.S. Cl. .................. 257/355; 257/173; 257/328; 257/357; 257/361; 257/362; 257/363; 257/546; 361/91.1; 361/56; 361/58; 360/323
(58) Field of Classification Search .................. 257/355, 257/361–363, 357, 173, 328, 547; 361/91, 361/56, 58; 360/323
See application file for complete search history.

(56) References Cited

U.S. PATENT DOCUMENTS

| 5,473,169 | A | * | 12/1995 | Ker et al. ...................... 257/173 |
| 2003/0179523 | A1 | * | 9/2003 | Kodama ...................... 361/56 |
| 2003/0197225 | A1 | * | 10/2003 | Chen et al. ................... 257/355 |
| 2004/0135141 | A1 | | 7/2004 | Pequignot et al. |

FOREIGN PATENT DOCUMENTS

| JP | 10-084098 | 3/1998 |
| JP | 2004-221569 | 8/2004 |
| KR | 1998-018323 | 6/1998 |
| KR | 10-0331857 | 3/2002 |

* cited by examiner

*Primary Examiner*—Lynne A Gurley
*Assistant Examiner*—Meiya Li
(74) *Attorney, Agent, or Firm*—Harness, Dickey & Pierce, PLC (57) ABSTRACT

An electrostatic discharge circuit between a first pad and a second pad including an electrostatic discharge circuit element, including a bipolar transistor path and a resistor path, the electrostatic discharge circuit element alternately discharging an electrostatic current through the bipolar transistor path and the resistor path.

20 Claims, 13 Drawing Sheets

ELECTROSTATIC DISCHARGE CIRCUIT AND METHOD OF DISSIPATING AN ELECTROSTATIC CURRENT

PRIORITY STATEMENT

This U.S. non-provisional application claims priority under 35 U.S.C. §119 of Korean Patent Application No. 2005-0011296, filed on Feb. 7, 2005, the entire contents of which are incorporated by reference.

BACKGROUND OF THE INVENTION

Electrical overstress, or EOS, refers to the destruction of a circuit due to excessive voltage, current, and/or power.

EOS is usually caused by improper application of excitation to a circuit, whether the circuit still being tested in the manufacturing line or it is already in the field. Simple socketing violations such as circuit misorientation and shifting can cause EOS damage, especially if the voltages intended for the power supply pins will be applied to stress-sensitive or power-limited pins. Improper excitation settings or voltage spikes in the excitation source are also common causes of EOS damage.

EOS damage is not always obvious. Some EOS events leave no apparent physical manifestation at all. Such EOS events can still render the affected component non-functional, even if no physical anomalies are observable. Weak EOS events may also occur, simply shifting the parametric performance of the affected component, but nonetheless affecting the over-all performance of the circuit.

Electrostatic Discharge (ESD) and latch-up and are two special cases of EOS.

An electrostatic discharge (ESD) is a sudden flow of electric current through a material that is normally an insulator. A large potential difference across the insulator may generate a strong electric field, converting the material's atoms into ions that conduct a current.

Electro-static discharge (ESD) may also be defined as a single-event, rapid transfer of electro-static charge between two objects, usually resulting when two objects at different potentials come into direct contact with each other.

ESD is a major cause of device failure in the semiconductor industry because integrated circuits are made from insulating materials such as silicon, which can break down if exposed to high voltages. Manufacturers and users of integrated circuits must take precautions to avoid and/or account for ESD.

A built-up electrostatic charge may be quickly discharged when the charged device comes into contact with another device, for example, an integrated circuit, especially when portions of the integrated circuit are connected to power supplies including ground. The electrostatic discharge may cause damage to the integrated circuit by causing dielectric breakdown of oxides and other thin films within the integrated circuit.

Dielectric breakdown refers to the destruction of a dielectric layer, usually as a result of excessive potential difference or voltage across the dielectric layer. Dielectric breakdown may be manifested as a short or leakage at the point of breakdown.

SiO2 breakdown is believed to be due to charge injection, and may be broken down into two stages. During the first stage, current starts to flow through the oxide as a result of the voltage applied across it. High field/high current regions are then formed as charges are trapped in the oxide. Eventually, these abnormal regions reach the second stage, a critical point wherein the oxide heats up and allows a greater current flow. This results in an electrical and thermal runaway that quickly leads to the physical destruction of the oxide.

Damage to an integrated circuit may also result from higher than normal levels of conduction through relatively small areas of the integrated circuit arising from reverse breakdown of p-n junctions in the integrated circuit.

Latch-up pertains to a failure mechanism wherein a parasitic thyristor (for example, a parasitic silicon controlled rectifier, or SCR) is inadvertently created within a circuit, causing a high amount of current to continuously flow through the circuit once the current is accidentally triggered or turned on. Depending on the circuits involved, the amount of current flow produced by this mechanism can be large enough to result in permanent destruction of the device due to electrical overstress (EOS).

An SCR is a three-terminal, four-layered p-n-p-n device that basically includes a PNP transistor and an NPN transistor. An SCR is off during its normal state but will conduct current in one direction (from anode to cathode) once triggered at its gate, and will do so continuously as long as the current through it stays above a holding level. Triggering the emitter of the PNP transistor into conduction injects current into the base of the NPN transistor. This drives the PNP transistor into conduction, which forward biases the emitter-base junction of the NPN transistor further, causing the NPN transistor to feed more current into the base of the PNP transistor. Thus, the NPN transistor and the PNP transistor feed each other with currents that keep both of them saturated.

Events that can trigger parasitic thyristors into a latch-up condition include excessive supply voltages, voltages at I/O pins that exceed the supply rails by more than a diode drop, improper sequencing of multiple power supplies, and various spikes and transients. Once triggered into conduction, the amount of current flow that results may depend on current limiting factors along the current path. In cases where the current is not sufficiently limited, EOS damage such as metal burn-out can occur.

Figure 1:
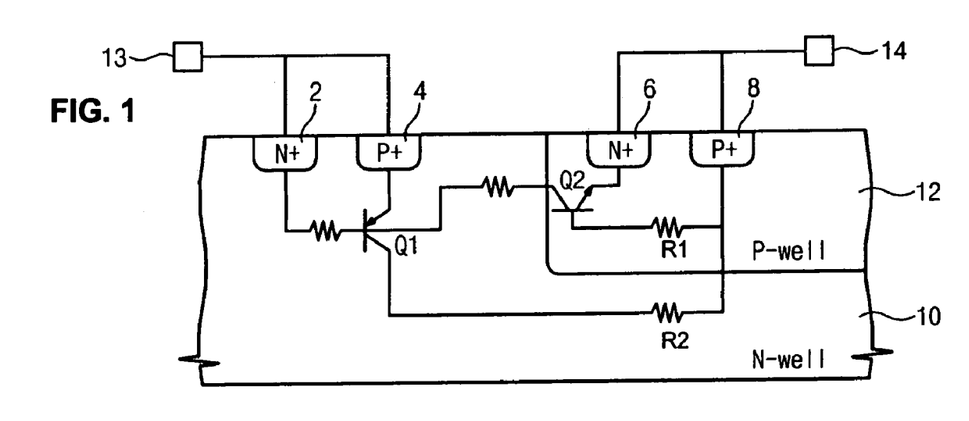
FIG. 1 illustrates a conventional SCR, used to control ESD.

FIG. 1 illustrates a conventional SCR, used to control ESD. As illustrated in FIG. 1, a conventional SCR may include a first diffusion layer 2, for example of n-type, a second diffusion layer 4, for example, of p-type, a third diffusion layer 6, for example, of n-type, and a fourth diffusion layer 8, for example, of p-type. A conventional SCR may also include an n-well 10, a p-well 12, a first pad, for example, a VDD pad, and a second pad 14, for example, a VSS pad.

As shown in FIG. 1, a pnpn SCR is effectively connected between a protected line and each terminal of the power supply, VDD and VSS. The SCR essentially includes a first pnp bipolar transistor Q1 and the second npn bipolar transistor Q2. As shown in FIG. 1, an emitter (for example, the second diffusion layer 4) of the pnp bipolar transistor Q1 and the collector (for example, the first diffusion layer 2) of the npn bipolar transistor Q2 are connected to one of the terminals, for example, the first pad 13. The emitter (for example, the third diffusion layer 6) of the npn bipolar transistor Q2 and the collector (for example, the fourth diffusion layer 8) of the pnp bipolar transistor Q1 may be connected to the other terminal, for example, the second pad 14. As shown in FIG. 1, the base of the npn bipolar transistor Q2 may have the same diffusion (for example, the p-well 12) as the collector of the pnp bipolar transistor Q1 and the base of the pnp bipolar transistor Q1 may have the same diffusion (for example, the n-well 10) as the collector of the npn bipolar transistor Q2.

As set forth above, a conventional SCR is a normally off device, in a "blocking state", in which negligible current flows therethrough. In its normally off state, a conventional SCR prevents a high impedance path between power supplies.

During an ESD event, for example, when the first pad 13 is at a high voltage and the second pad 14 is a ground, a circuit path for ESD current may be traced from VDD to VSS in separate paths, for example, a pnp path and an npn path, through the two bipolar transistors Q1, Q2 that form the SCR. Current is injected into the base of the npn bipolar transistor Q2, which causes a current flow in the base-emitter junction of the pnp bipolar transistor Q1. This current flow causes the pnp bipolar transistor Q1 to turn on causing further current to be injected into the base of the npn bipolar transistor Q2. This phenomenon is called a "positive-feedback condition", which pushes the SCR into a regeneration mode from a low impedance discharge channel to safely shunt the ESD current.

Figure 2:
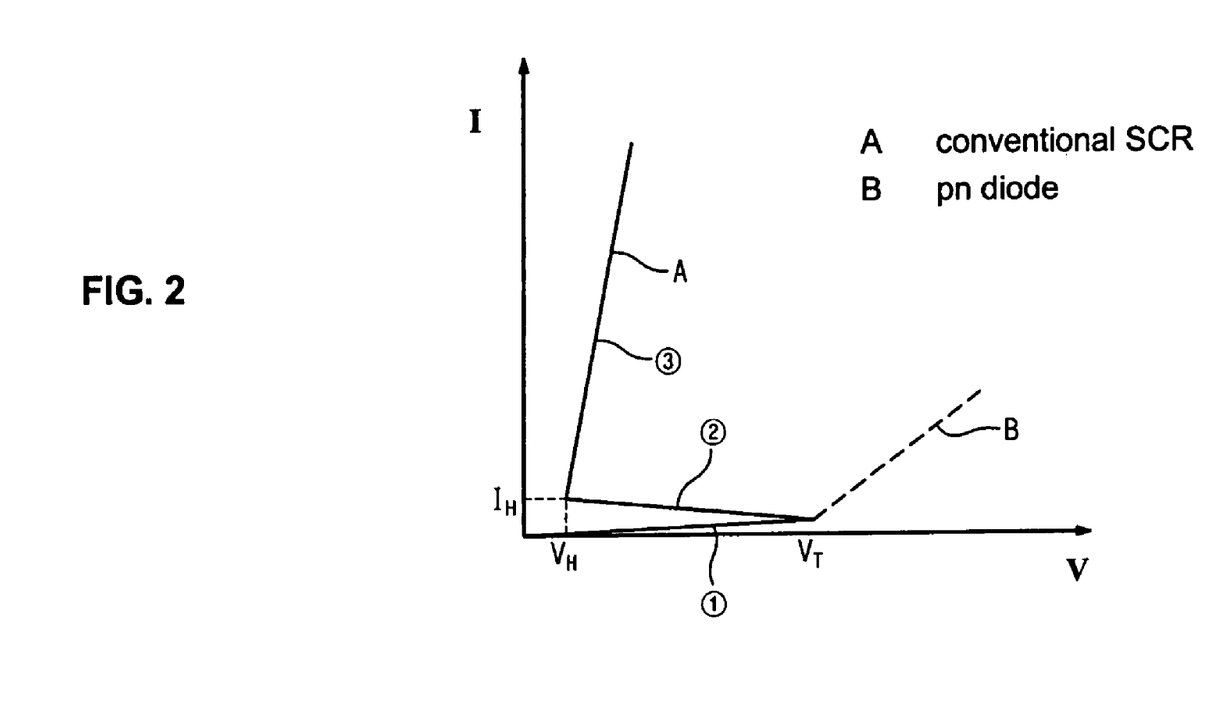
FIG. 2 illustrates an example ESD characteristic curve of two conventional ESD protection devices, including the conventional SCR described in the FIG. 1, illustrated as curve A, and a conventional pn diode, illustrated as curve B.

FIG. 2 illustrates an example ESD characteristic curve of two conventional ESD protection devices, including a conventional SCR, for example, such as the conventional one described in the FIG. 1, illustrated as curve A, and a conventional pn diode, illustrated as curve B. As shown in FIG. 2, the ESD characteristic curve for a conventional SCR includes three distinct portions 1-3. In portion 1, under an ESD-stress condition, the voltage V is less than a terminal voltage $V_T$, which results in a high-impedance condition, where the potential of the n-well 10 increases.

At the beginning of portion 2, where $V=V_T$, a junction breakdown (or avalanche breakdown) occurs at the common collector-base junction. The avalanche-generated holes raise the p-well 12 potential and avalanche-generated electrons raise the n-well 10 potential, which turns on the npn and pnp bipolar transistors.

Which of the npn and pnp bipolar transistor turns on first depends on the values of resistors R1 and R2, and the current gains of the two bipolar transistors. Latch-up occurs when a voltage spike activates one of a pair of bipolar transistors, which combine a circuit with a large positive feedback. As a result, a large current can flow out through the collectors. As the SCR moves into the "on" state, an I/O pad voltage may be clamped to a safe holding voltage. This results in a drastic decrease in the voltage to a hold voltage voltage $V_H$, as shown in portion 2 of curve A of FIG. 2.

In portion 3, if a current inflow continues or a voltage over $V_H$ is applied on the pad, this results in a low-impedance condition. Latch-up may be defined as the creation of a low-impedance path between power supply rails as a result of triggering. In this condition, excessive current flow is possible and the device may go into thermal breakdown. The device temperature may increase to such a level that thermal carrier generation is high enough to dominate the conduction process. Because the current flow in portion 3 is too high, localized thermal damage may occur in the semiconductor device. The uncontrolled current increase shown in portion 3 of curve A is a problem with conventional SCR devices.

Curve B illustrates the ESD characteristic curve of a conventional pn diode. As shown in portion 1 of curve B, current increases very slowly; as a result, a conventional pn diode is not suitable for instantaneously discharging a large current.

SUMMARY OF THE INVENTION

Example embodiments of the present invention are directed to an electrostatic discharge circuit including a first well of a first conductivity type, connected to a first pad, a second well of the first conductivity type, connected to a second pad, a third well of a second conductivity type, connected to a first pad, and a switching pathway of the first conductivity type, formed in the third well, and connecting the first well and the second well.

Other example embodiments of the present invention are directed to an electrostatic discharge circuit between a first pad and a second pad including an electrostatic discharge circuit element, including a bipolar transistor path and a resistor path, the electrostatic discharge circuit element alternately discharging an electrostatic current through the bipolar transistor path and the resistor path.

Other example embodiments of the present invention are directed to a method of dissipating an electrostatic current caused by an electrostatic discharge event including alternately discharging the electrostatic current through a bipolar transistor path and a resistor path.

Other example embodiments of the present invention are directed to an electrostatic discharge circuit including a first pad and a second pad and an electrostatic discharge circuit element, connected between the first pad and a second pad, the electrostatic discharge circuit element including means for alternately discharging an electrostatic current through a bipolar transistor path and a resistor path.

Other example embodiments of the present invention are directed to an electrostatic discharge circuit including a first pad and a second pad and an electrostatic discharge circuit element, connected between the first pad and a second pad, the electrostatic discharge circuit element including means for controlling a voltage across the electrostatic discharge circuit element between a trigger voltage and a hold voltage to discharge an electrostatic current.

In example embodiments of the present invention, the first conductivity type is positive and the second conductivity type is negative.

In example embodiments of the present invention, the first pad is connected to a drive voltage and the second pad is connected to a ground voltage.

In example embodiments of the present invention, the switching pathway forms a resistor path to discharge an electrostatic current.

In example embodiments of the present invention, the first well, the second well, and the third well form a bipolar transistor path to discharge the electrostatic current.

In example embodiments of the present invention, the resistor path and the bipolar transistor path alternately discharge the electrostatic current.

In example embodiments of the present invention, alternately discharging the electrostatic current through the bipolar transistor path includes inducing current flow through at least two bipolar transistors to create a positive-feedback condition to form a low impedance discharge channel to shunt the electrostatic current.

In example embodiments of the present invention, alternately discharging the electrostatic current through the resistor path includes forming a depletion region near an np junction due to the positive-feedback condition, to allow current flow through at least one switching pathway of the resistor path.

In example embodiments of the present invention, alternately discharging the electrostatic current through the resistor path further includes forming a full depletion region near the np junction, which cuts off the current flow through the at least one switching pathway of the resistor path.

In example embodiments of the present invention, alternately discharging the electrostatic current through the bipolar transistor path further includes inducing the current flow through the at least two bipolar transistors again, in response to the cutting off the current flow through the at least one switching pathway of the resistor path.

In example embodiments of the present invention, the resistor path includes a switching pathway.

In example embodiments of the present invention, the switching pathway is located between adjacent contact holes.

In example embodiments of the present invention, the switching pathway has a width (W) sufficient to form a full depletion region across the switching pathway.

In example embodiments of the present invention, the bipolar transistor path includes a silicon controlled rectifier.

In example embodiments of the present invention, the silicon controlled rectifier includes a pnp bipolar transistor and an npn bipolar transistor.

In example embodiments of the present invention, the silicon controlled rectifier further including a first resistor corresponding to the npn bipolar transistor and a second resistor corresponding to the pnp bipolar transistor.

In example embodiments of the present invention, the pnp bipolar transistor and the npn bipolar transistor operate in a positive-feedback condition to push the silicon controlled rectifier into a regeneration mode to form a low impedance discharge channel to shunt the electrostatic current.

In example embodiments of the present invention, the electrostatic discharge circuit further includes an isolation layer defining an active region including the switching pathway and/or a guard ring of the second conductivity type, for defining a lower voltage area and for directing power to at least one of the first well, the second well, and the third well.

In example embodiments of the present invention, at least one of the first well and the second well are formed in the third well.

In example embodiments of the present invention, the first well is formed in the third well and the second well is formed in a substrate of the first conductivity type.

BRIEF DESCRIPTION OF THE DRAWINGS

The present invention will become more fully understood from the detailed description given below and the accompanying drawings, which are given for purposes of illustration only, and thus do not limit the invention.

It should be noted that these Figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention.

DETAILED DESCRIPTIONS OF EXAMPLE EMBODIMENTS

Figure 3A:
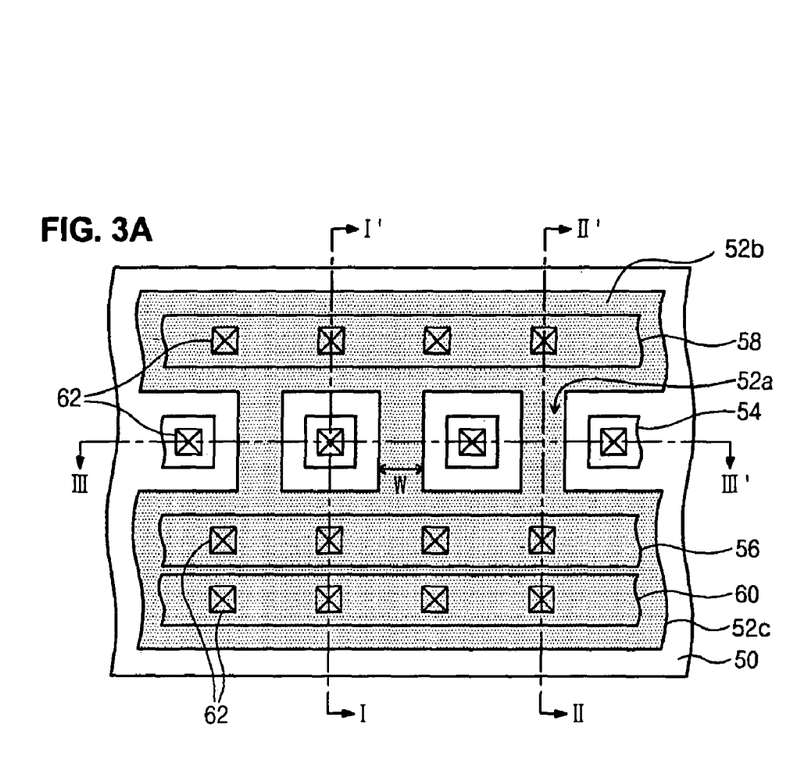
FIGS. 3A-3D illustrate an electrostatic discharge circuit in accordance with an example embodiment in the present invention.

FIGS. 3A-3D illustrate an electrostatic discharge circuit in accordance with an example embodiment in the present invention. As illustrated in FIG. 3A, an electrostatic discharge circuit may include a well 50 of a first conductivity type, for example an n-type well and a well 52 of a second conductivity type, for example p-type.

The well 52 may further include one or more switching pathways 52a, of a second conductivity type, for example a p-type, a well 52b of a second conductivity type, for example a p-type and a well 52c, also of a second conductivity type, for example, a p-type.

The well 50 may include a first diffusion layer 54, for example of an n-type. The well 52b may include a third diffusion layer 58, for example of a p-type. The well 52c may include a second diffusion layer 56, for example of an n-type, and a fourth diffusion layer 60, for example of a p-type.

The first diffusion layer 54 may be connected to a first pad 64 (shown in FIGS. 3B-3D), for example a $V_{DD}$ pad, connected to a drive voltage. The third diffusion layer 58 may also be connected to the first pad 64.

The second diffusion layer 56 and the fourth diffusion layer 60 may be connected to a second pad 66 (shown in FIGS. 3B-3D), for example, a Vhd SS pad, connected to a ground voltage. Each of the first through fourth diffusion layers 54, 56, 58, 60 may include one or more contact holes 62.

Figure 3B:
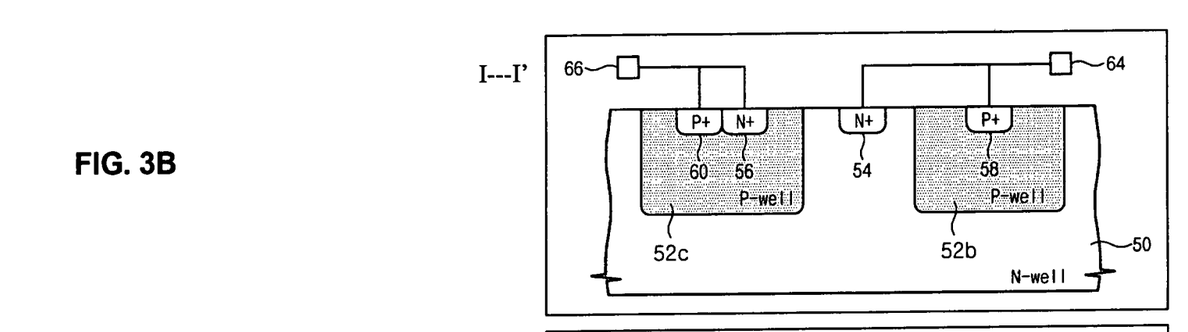
Figure 3C:
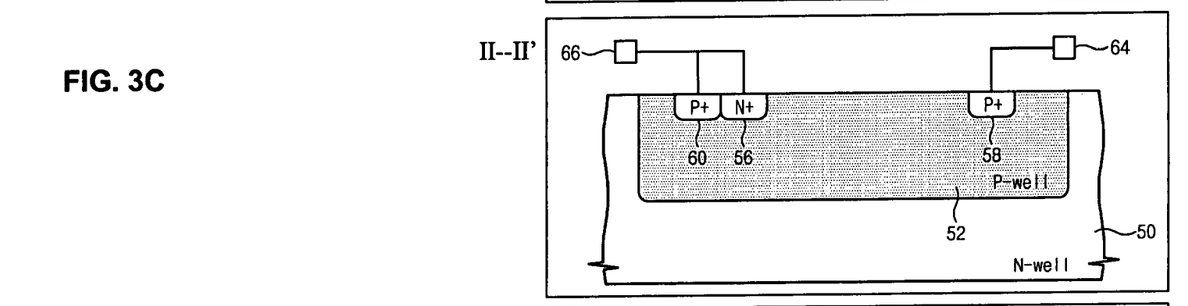
Figure 3D:
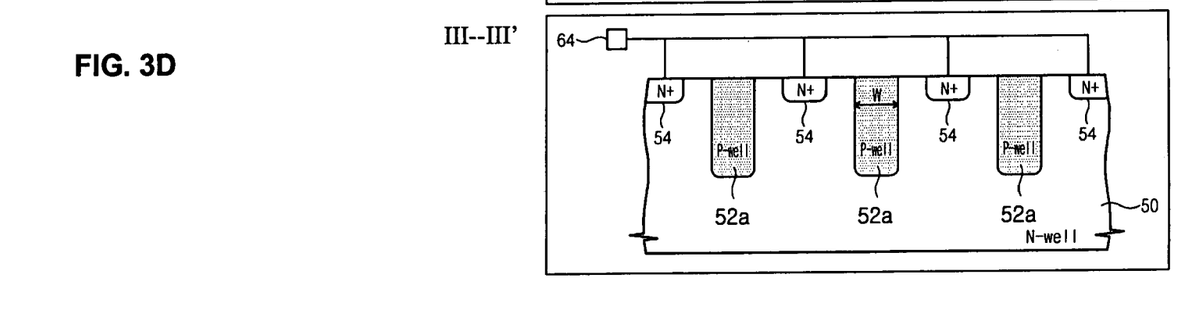

FIGS. 3B-3D illustrate cross-sections of the electrostatic discharge circuit of FIG. 3A at I-I', II-II' and III-III', respectively. As shown in FIGS. 3A and 3D, the well of a second conductivity type 52 may include a switching pathway 52a, in addition to the well 52b and 52c. Each of the switching pathways 52a may have a width W, as illustrated in FIGS. 3A and 3D.

Figure 4A:
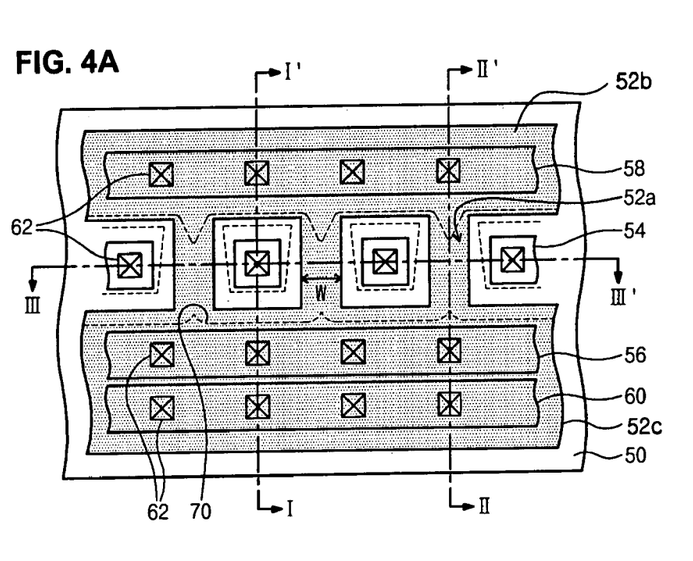
FIGS. 4A-4C illustrate example normal operation of the example electrostatic discharge circuit of FIGS. 3A-3D, in accordance with an example embodiment of the present invention.
Figure 4B:
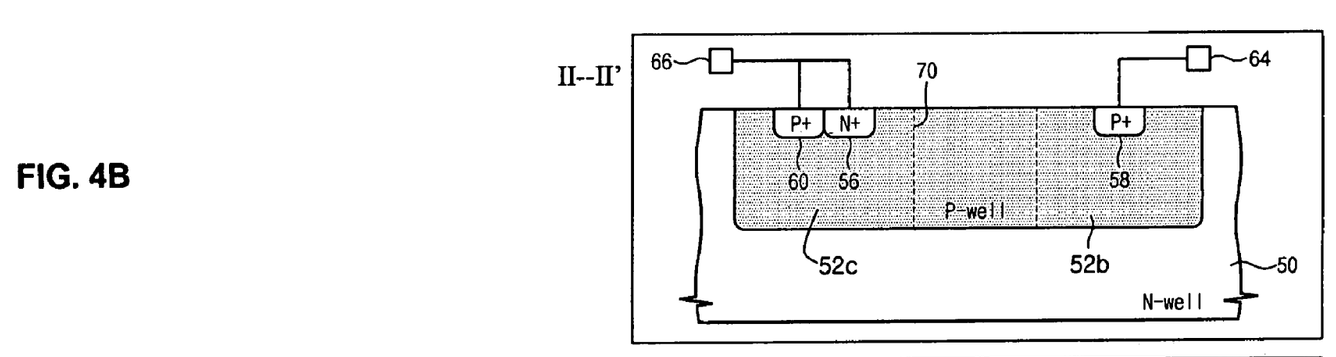
Figure 4C:
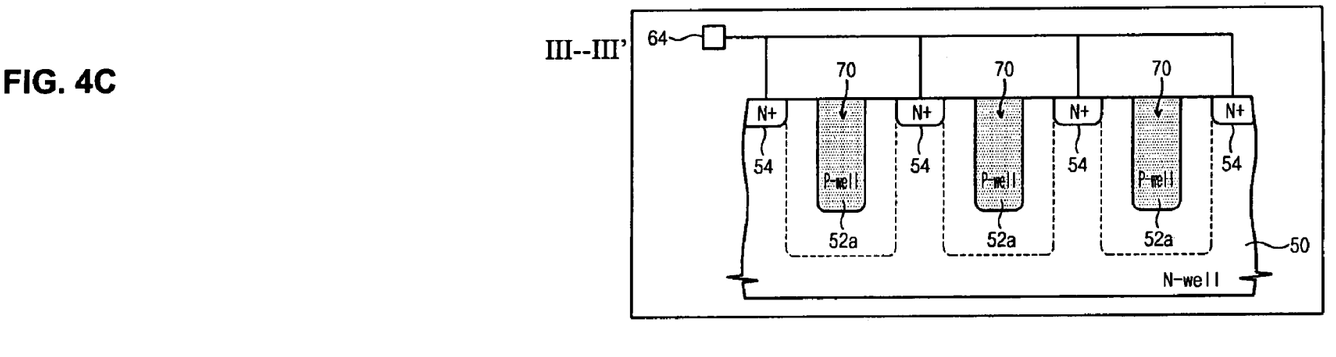

FIGS. 4A-4C illustrate the operation of the example electrostatic discharge circuit of FIGS. 3A-3D, in an example embodiment of the present invention.

FIG. 4A illustrates normal operation of the layout illustrated in FIGS. 3A-3D. As shown in FIG. 4A, in normal operation, a reverse bias voltage is created at the np junction of the well 50 of n-type and the well 52 of p-type, which creates a depletion region 70 in the well 52 of p-type (and also a depletion region in the well 50 of n-type) near the switching pathways 52a.

In an example embodiment, a width W of the switching pathways 52a may be determined such that the switching pathways 52a may be opened or closed. In an example embodiment, the doping concentration of the switching pathway 52a and/or an applied voltage may be controlled, in order to control the switching pathways 52a to be open or closed.

In an example embodiment, the width W of the switching pathways 52a may be controlled so that the depletion regions 70 on each side of the switching pathways 52a meet and form a full depletion region in each switching pathway 52a. A full depletion region 70 will cut off the current path between the well 52b of the second conductivity type, connected to the first pad 64 and the well 52c of the second conductivity type, connected to second pad 66. As a result, no current will flow from the first pad 64 (for example, the $V_{DD}$ pad) to the second pad 66, (for example, the $V_{SS}$ pad). As set forth above, this is the normal operation of the electrostatic discharge circuit of FIGS. 3A-3D.

Figure 5A:
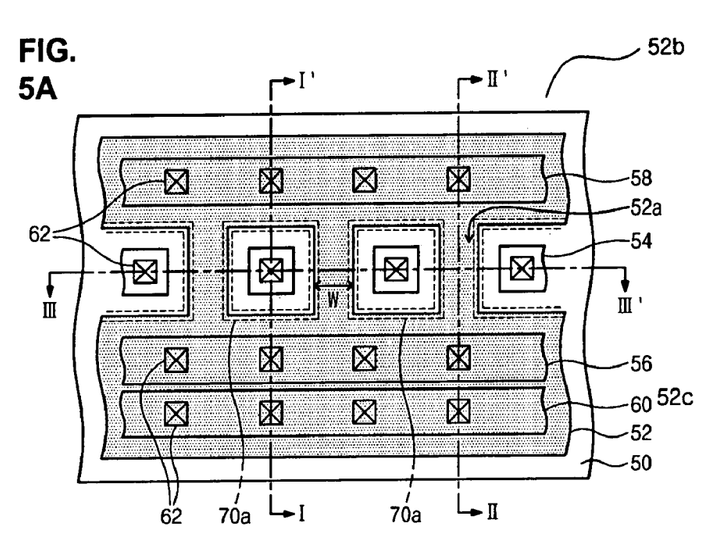
FIGS. 5A-5C illustrate example operation of the example electrostatic discharge circuit of FIGS. 3A-3D, during an ESD event, in accordance with an example embodiment of the present invention.
Figure 5B:
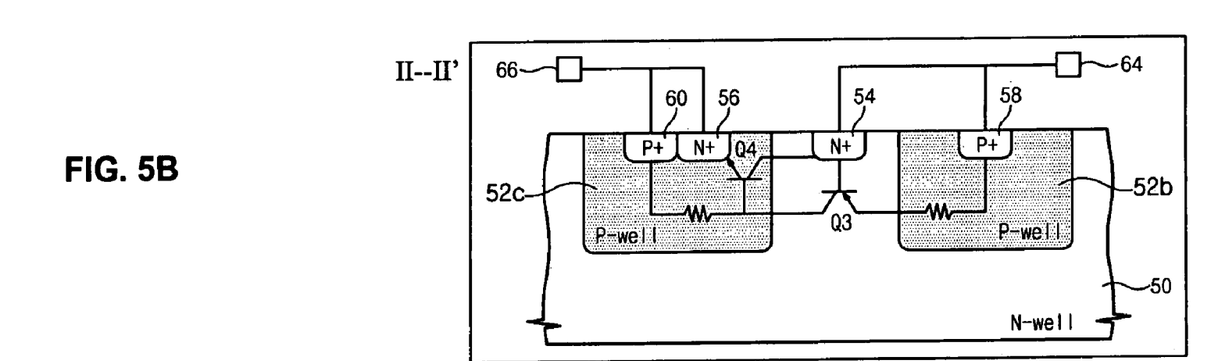
Figure 5C:
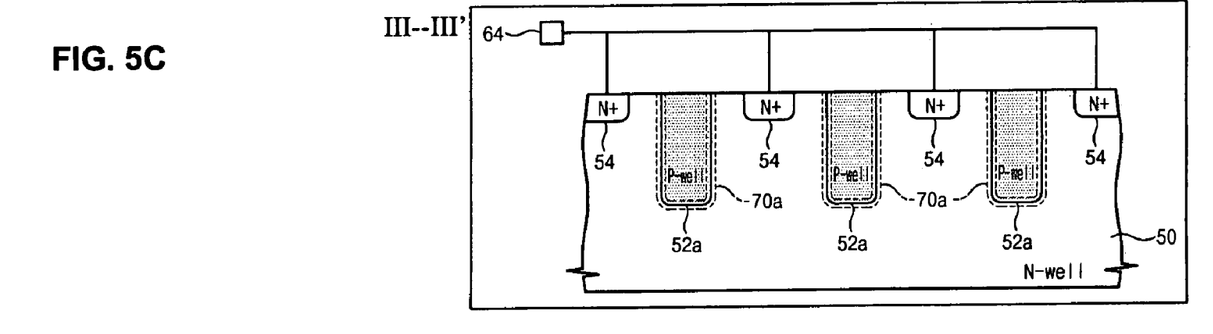

FIGS. 5A-5C illustrate an example operation of the ESD circuit of FIGS. 3A-3D, during an ESD event.

At a point where the NP junction between the well 50 of n-type and the well 52 of p-type breaks down, the PNP bipolar transistor Q3 and the NPN bipolar transistor Q4 illustrated in FIG. 5B turn on. As a result, current from the first pad 64 is permitted to flow to the second pad 66 through the pnpn connection 58, 52b, 50, 52c, 56, and the depletion regions 70, near the NP junction, become shallower due to a positive feedback phenomenon. During this period, the switching pathways 52a are open, current is permitted to flow from the first pad 64 to the second pad 66 through the switching pathways 52a, and the potential of the switching pathways 52a increases. As the potential of the switching pathways 52a increases, eventually, a full depletion region 70 is again formed in the switching pathways 52a. The full depletion region 70 cuts off the current path through the switching pathways 52a, as described above in conjunction with normal operation of the electrostatic discharge circuit. In this manner, a loop is formed, where the switching pathways 52a alternately open and close and the ESD current is alternately dissipated by the switching pathways 52a, in the form of a resistor path, and the conventional pnpn SCR, in the form of a bipolar transistor path, until the ESD current is dissipated.

Figure 6:
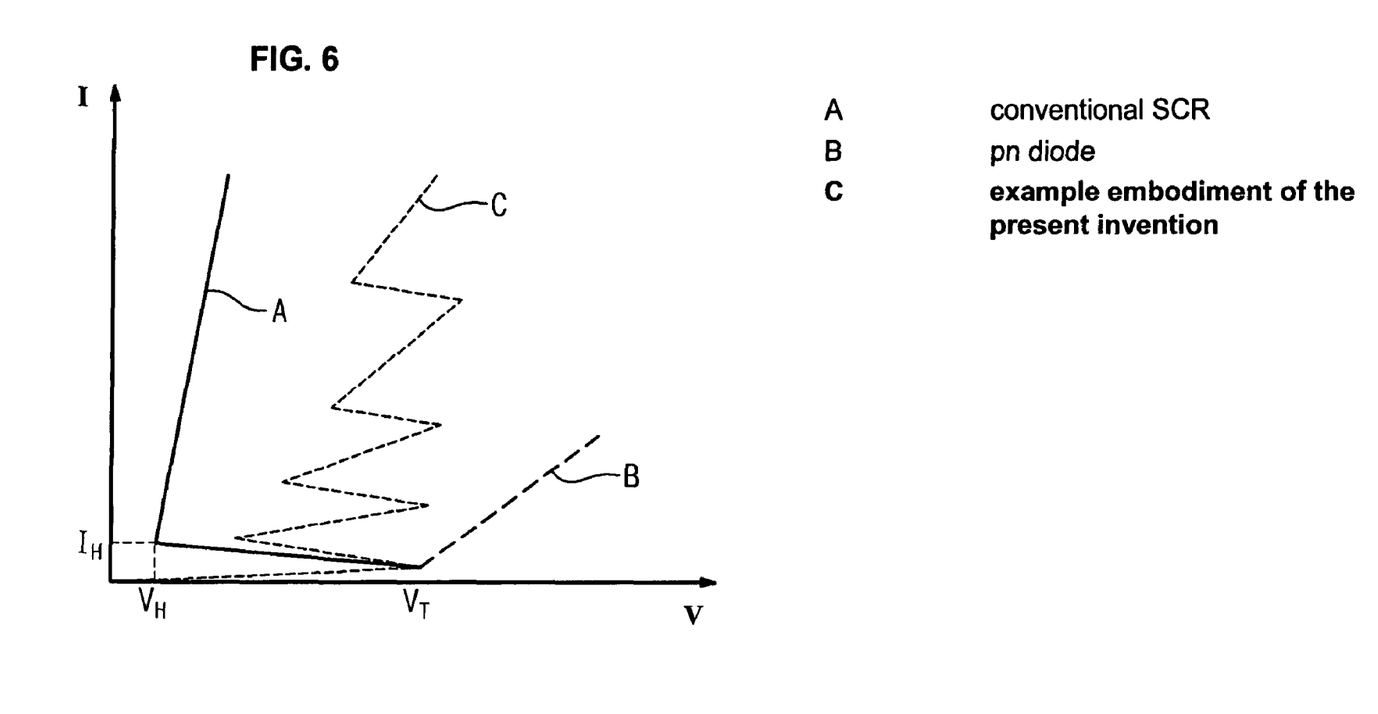
FIG. 6 illustrates a comparison of the ESD characteristic curve of the example electrostatic discharge circuit illustrated in FIGS. 3A-3D of the present application, and the two conventional devices of FIG. 2.

FIG. 6 illustrates a comparison of the ESD characteristic curve of the example electrostatic discharge circuit illustrated in FIGS. 3A-3D of the present application, a conventional SCR, and a pn diode. As illustrated in FIG. 6, curves A and B of the of the conventional SCR and pn diode, respectively, are essentially the same as the curves shown in FIG. 2. The ESD characteristic curve of an example embodiment of the present invention illustrated in FIGS. 3A-3D is shown as curve C.

As shown in portion 1 of curve A, under an ESD-stress condition, the voltage V is less than a terminal voltage $V_T$, which results in a high-impedance condition, where the potential of the n-well 10 increases.

At the beginning of portion 2 of curve A, where $V=V_T$, a junction breakdown (or avalanche breakdown) occurs at the common collector-base junction. The avalanche-generated holes raise the p-well 12 potential and the electrons raise the n-well 10 potential, which turns on the npn and pnp bipolar transistors.

Curve C, which is the ESD characteristic curve of an example embodiment of the present invention illustrated in FIGS. 3A-3D is similar to the ESD characteristic curve of a conventional SCR in portions 1 and 2. This is to be expected as the ESD circuit of FIGS. 3A-3D includes the pnpn arrangement of the conventional SCR.

However, the ESD characteristic curve of an example embodiment of the present invention illustrated in FIGS. 3A-3D differs from the ESD characteristic curve of a conventional SCR in portion 3.

In portion 3 of the ESD characteristic curve of a conventional SCR, if a current inflow continues or a voltage over $V_H$ is applied on the pad, this results in a low-impedance condition. In this condition, excessive current flow is possible and the device goes into thermal breakdown, as illustrated the uncontrolled current increase in portion 3 of Curve A.

In contrast, in portion 3 of the ESD characteristic curve C, of the ESD circuit of an example embodiment of the present invention, the switching pathways 52a are used prevent an uncontrolled current increase.

As shown, curve 3C essentially alternates between two positions, a snapback position (portion 2), where current increases, and a switching portion (portion 3), where voltage increases. As illustrated by curve C, each of these phenomenon occur alternately and illustrate that the path by which the current flows alternates between the conventional pnpn SCR and the switching pathways. Such alternation, prevents current crowding and a localized thermal damage in the semiconductor device by dividing the path of the EDS or EOS current.

Figure 7A:
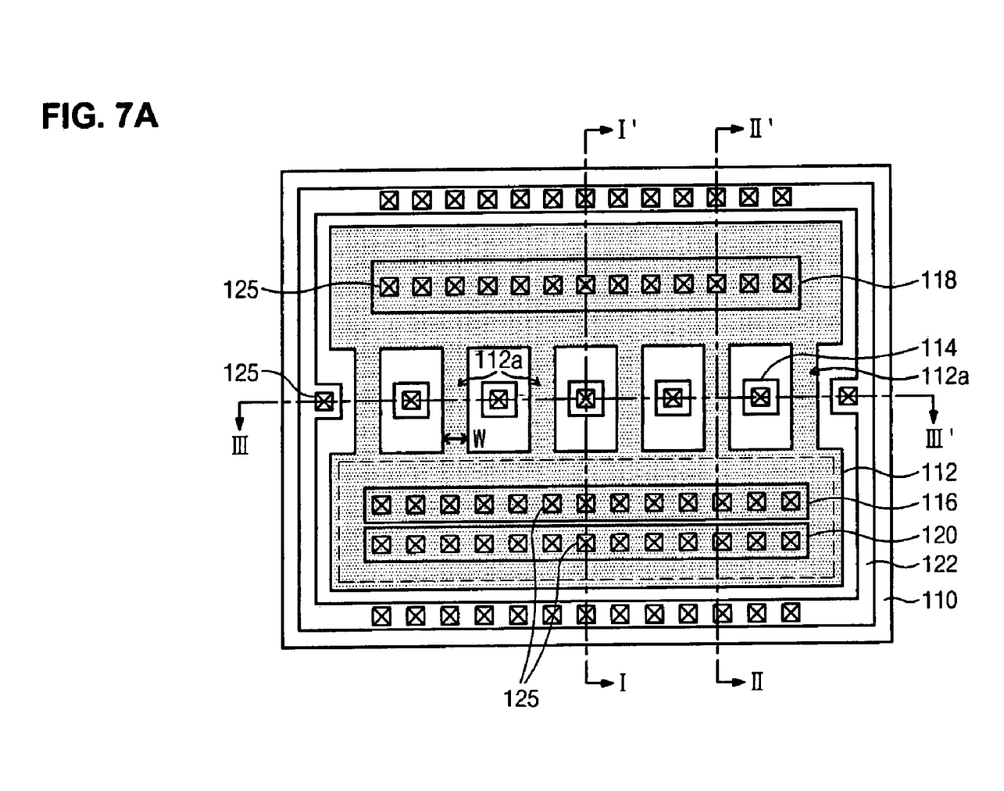
FIGS. 7A-7D illustrate an electrostatic discharge circuit in accordance with another example embodiment in the present invention.

FIGS. 7A-7D illustrate an electrostatic discharge circuit in accordance with another example embodiment in the present invention. As illustrated in FIG. 7A, an electrostatic discharge circuit may include a well 110 of a first conductivity type, for example an n-type well and a well 112 of a second conductivity type, for example p-type.

The well 112 may further include one ore more switching pathways 112a, of a second conductivity type, for example a p-type, a well 112b of a second conductivity type, for example a p-type and a well 112c, also of a second conductivity type, for example, a p-type.

The well 110 may include a first diffusion layer 114, for example of an n-type. The well 112b may include a third diffusion layer 118, for example of a p-type. The well 112c may include a second diffusion layer 116, for example of an n-type, and a fourth diffusion layer 120, for example of a p-type.

The first diffusion layer 114 may be connected to a first pad 124 (shown in FIGS. 7B-7D), for example a $V_{DD}$ pad, connected to a drive voltage. The third diffusion layer 118 may also be connected to the first pad 124.

The second diffusion layer 116 and the fourth diffusion layer 120 may be connected to a second pad 126 (shown in FIGS. 7B-7D), for example, a $V_{SS}$ pad, connected to a ground voltage. Each of the first through fourth diffusion layers 114, 116, 118, 120 may include one or more contact holes 125.

Figure 7B:
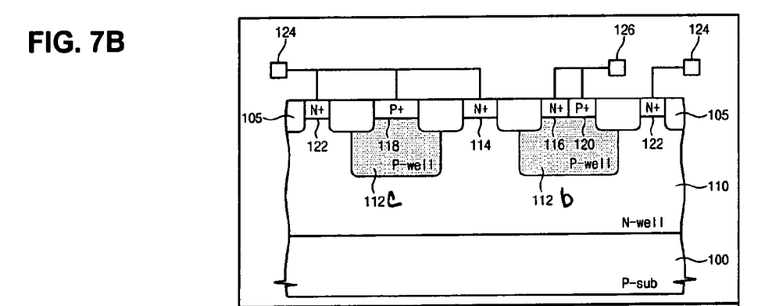
Figure 7C:
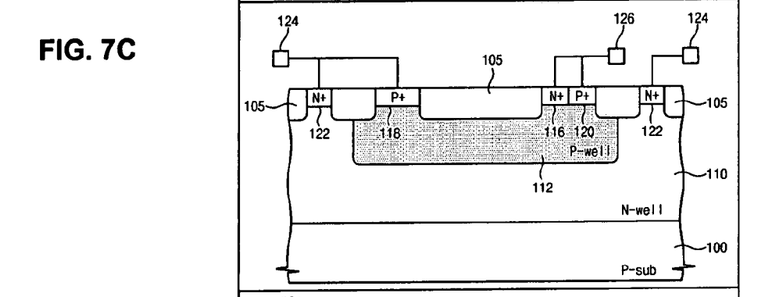
Figure 7D:
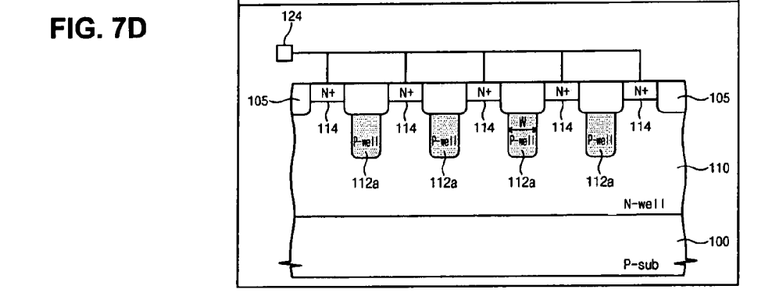

FIGS. 7B-7D illustrate cross-sections of the electrostatic discharge circuit of FIG. 7A at I-I', II-II' and III-III', respectively. As shown in FIGS. 7A and 7D, the well of a second conductivity type 112 may include a switching pathway 112a, in addition to the well 112b and 112c. Each of the switching pathways 112a may have a width W, as illustrated in FIGS. 7A and 7D.

As shown in FIGS. 7A-7D, the electrostatic discharge circuit may further include an isolation layer 105 and/or a guard ring 122. In an example embodiment, the isolation layer 105 defines an active region including the switching pathway 112a. In an example embodiment, the guard ring 122 is of the second conductivity type, and defines a lower voltage area and for directing power to at least one of the well 110 of the first conductivity type, the well 112b of the second conductivity type and the well 112c, also of the second conductivity type. In an example embodiment, the lower voltage area helps maintain voltage uniformity.

Figure 8A:
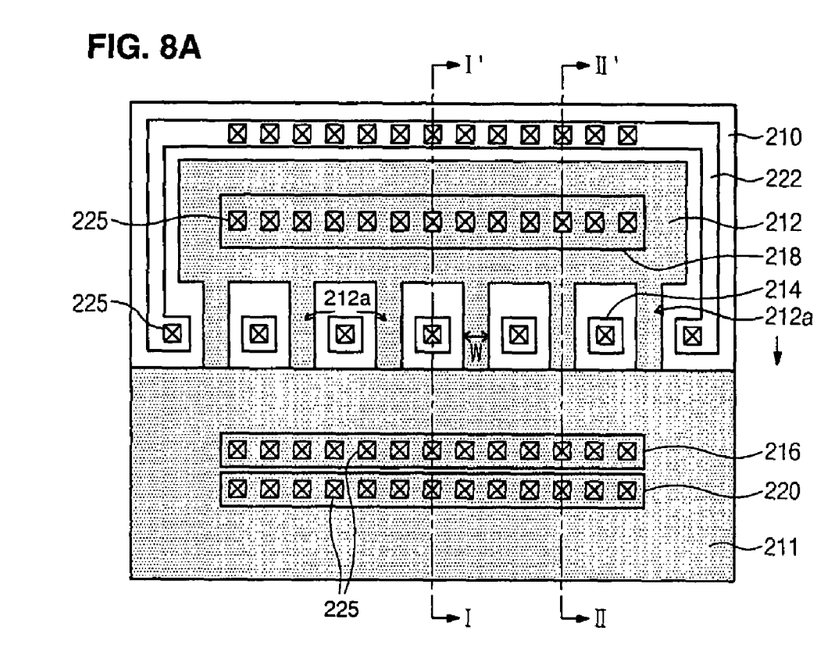
FIGS. 8A-8C illustrate an electrostatic discharge circuit in accordance with another example embodiment in the present invention.
Figure 8B:
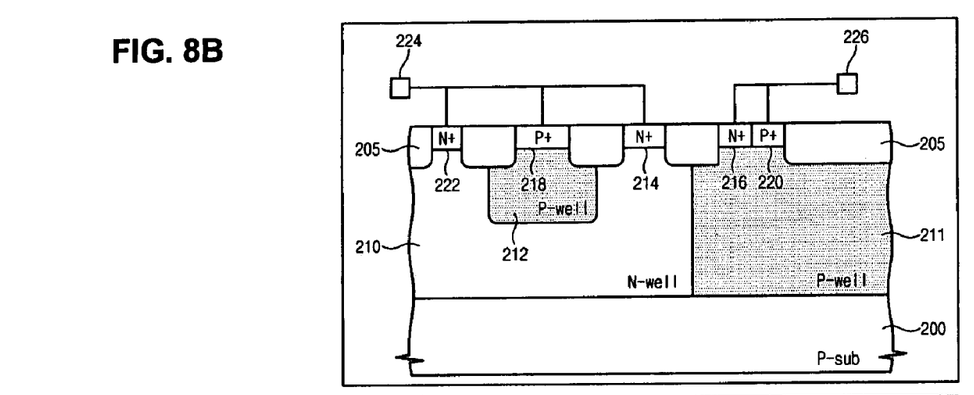
Figure 8C:
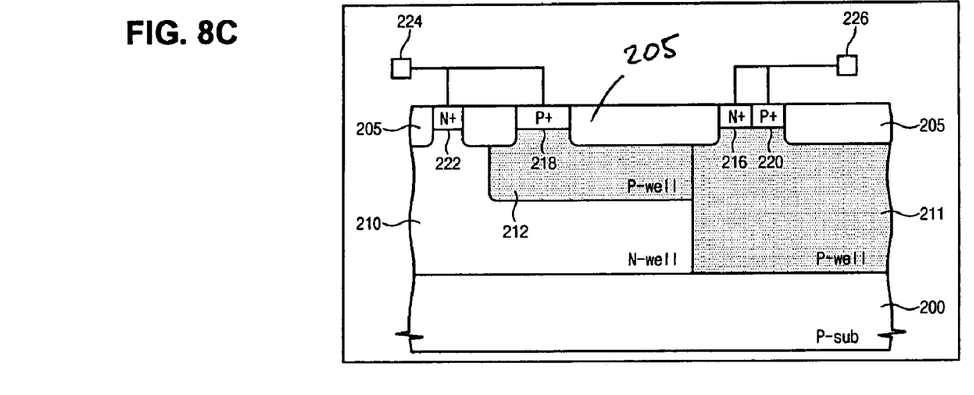

FIGS. 8A-8C illustrate another example embodiment of the present invention.

As illustrated in FIG. 8A, an electrostatic discharge circuit may include a well 210 of a first conductivity type, for example an n-type well, a well 211 of a second conductivity type, for example p-type, and a well 212 of a second conductivity type, for example p-type.

The well 210 may include a first diffusion layer 214, for example of an n-type and a third diffusion layer 218, for example of a p-type. The well 212 may include a second diffusion layer 216, for example of an n-type and a fourth diffusion layer 220, for example of a p-type.

The first diffusion layer 214 may be connected to a first pad 224 (shown in FIGS. 8B-8C), for example a $V_{DD}$ pad, connected to a drive voltage. The third diffusion layer 218 may also be connected to the first pad 224.

The second diffusion layer 216 and the fourth diffusion layer 220 may be connected to a second pad 226 (shown in FIGS. 8B-8C), for example, a $V_{SS}$ pad, connected to a ground voltage. Each of the first through fourth diffusion layers 214, 216, 218, 220 may include one or more contact holes 225.

FIGS. 8B-8C illustrate cross-sections of the electrostatic discharge circuit of FIG. 8A at I-I' and 11-II', respectively. As shown in FIGS. 8A and 8C, the well of a second conductivity type 212 may include one or more switching pathways 212a. Each of the switching pathways 212a may have a width W, as illustrated in FIGS. 8A and 8C.

As shown in FIGS. 8A-8C, the electrostatic discharge circuit may further include an isolation layer 205 and/or a guard ring 222. In an example embodiment, the isolation layer 205 defines an active region including the switching pathway 212a. In an example embodiment, the guard ring 222 is of the second conductivity type, and defines a lower voltage area and for directing power to at least one of the well 210 of the first conductivity type and the well 212 of the second conductivity type.

Although various elements of example embodiments of the present invention have been described as having a given conductivity, it is to be recognized that the conductivities of any element may be reversed without departing from the spirit and scope of the present invention.

Although various elements of example embodiments of the present invention have been described as switching between a resistor path and a bipolar transistor junction, it is to be recognized that switching between two or more other paths may be performed without departing from the spirit and scope of the present invention.

It will be apparent to those skilled in the art that other changes and modifications may be made in the above-described example embodiments without departing from the scope of the invention herein, and it is intended that all matter contained in the above description shall be interpreted in an illustrative and not a limiting sense.

What is claim is:

1. An electrostatic discharge circuit comprising:
   a first well of a first conductivity type, connected to a first pad;
   a second well of the first conductivity type, connected to a second pad;
   a third well of a second conductivity type, connected to the first pad; and
   a switching pathway of the first conductivity type in the third well, the switching pathway connecting the first well and the second well,
   wherein voltages applied to the first pad and the second pad are different from each other, and
   the discharge circuit is configured to alternate a discharge of a current of an electrostatic discharge (ESD) event between a plurality of paths a plurality of times, the plurality of paths including the switching pathway.

2. The electrostatic discharge circuit of claim 1, wherein the first conductivity type is positive and the second conductivity type is negative.

3. The electrostatic discharge circuit of claim 1, wherein the first pad is connected to a drive voltage and the second pad is connected to a ground voltage under a normal operation of the electrostatic discharge circuit, and the first pad is connected to an electrostatic current under an electrostatic discharge (ESD) event of the electrostatic discharge circuit.

4. The electrostatic discharge circuit of claim 1, wherein the switching pathway includes a depletion region, and
   the switching pathway is configured so that a width of the depletion region is narrower than a width of the switching pathway, and the switching pathway includes a resistor path to discharge an electrostatic current, during at least part of the ESD event of the-electrostatic discharge circuit.

5. The electrostatic discharge circuit of claim 4, wherein the first well, the second well, and the third well are part of a bipolar transistor path, the plurality of paths including the bipolar transistor path.

6. The electrostatic discharge circuit of claim 1, wherein the first well includes a third diffusion layer of the first conductivity type, the third diffusion layer connected to the first pad.

7. The electrostatic discharge circuit of claim 6, wherein the second well includes a second diffusion layer of the second conductivity type and a fourth diffusion layer of the first conductivity type, the second diffusion layer and the fourth diffusion layer connected to the second pad.

8. The electrostatic discharge circuit of claim 7, wherein the third well includes a first diffusion layer of the second conductivity type, the first diffusion layer connected to the first pad.

9. The electrostatic discharge circuit of claim 1, wherein at least one of the first well and the second well are formed in the third well.

10. The electrostatic discharge circuit of claim 1, wherein the switching pathway includes a depletion region, and
    the switching pathway is configured to be at least substantially depleted under a normal operation of the electrostatic discharge circuit.

11. The electrostatic discharge circuit of claim 1, wherein the switching pathway is a plurality of switching pathways.

12. The electrostatic discharge circuit of claim 11, wherein the third well includes a first diffusion layer of the second conductivity type between the plurality of switching pathways.

13. An electrostatic discharge circuit between a first pad and a second pad, comprising:
    an electrostatic discharge circuit element, including a bipolar transistor path and a switching pathway, the switching pathway including a depletion region, the bipolar transistor path and the switching pathway between the first pad and the second pad,
    wherein the switching pathway is configured to be at least substantially depleted under a normal operation,
    the switching pathway is configured so that a width of the depletion region is narrower than a width of the switching pathway, and the switching pathway includes a resistor path, during at least part of an ESD event, and
    the electrostatic discharge circuit element is configured to alternate a discharge of an electrostatic current between the bipolar transistor path and the resistor path a plurality of times during the ESD event.

14. The electrostatic discharge circuit of claim 13, wherein the switching pathway is located between adjacent contact holes.

15. The electrostatic discharge circuit of claim 13, wherein the bipolar transistor path is part of at least one silicon controlled rectifier.

16. The electrostatic discharge circuit of claim 15, wherein the silicon controlled rectifier includes a pnp bipolar transistor and an npn bipolar transistor.

17. The electrostatic discharge circuit of claim 16, wherein the silicon controlled rectifier further includes a first resistor corresponding to the npn bipolar transistor and a second resistor corresponding to the pnp bipolar transistor.

18. The electrostatic discharge circuit of claim 17, wherein the pnp bipolar transistor and the npn bipolar transistor are configured to operate in a positive-feedback condition that pushes the silicon controlled rectifier into a regeneration mode in which a low impedance discharge channel shunts the electrostatic current.

19. An electrostatic discharge circuit comprising:
a first pad and a second pad; and
an electrostatic discharge circuit element connected between the first pad and the second pad, the electrostatic discharge circuit element including a device configured to alternate a discharge of an electrostatic current between a bipolar transistor path and a resistor path a plurality of times during an ESD event,
wherein the device is configured to include a switching pathway including a depletion region between the first pad and the second pad,
the switching pathway is configured to be at least substantially depleted under a normal operation, and
the switching pathway is configured so that a width of the depletion region is narrower than a width of the switching pathway, and the switching pathway includes the resistor path, during at least part of the ESD event.

20. An electrostatic discharge circuit comprising:
a first pad and a second pad; and
an electrostatic discharge circuit element connected between the first pad and the second pad, the electrostatic discharge circuit element including a device configured to control a voltage across the electrostatic discharge circuit element between a trigger voltage and a hold voltage to alternate discharge an electrostatic current a plurality of times under an ESD event,
wherein the device is configured to include a switching pathway including a depletion region between the first pad and the second pad,
the switching pathway is configured to be at least substantially depleted under a normal operation, and
the switching pathway is configured so that a width of the depletion region is narrower than a width of the switching pathway, and the switching pathway includes a resistor path, during at least part of the ESD event.

* * * * *